United States Patent [19]

Stevens et al.

[11] Patent Number: 5,556,791
[45] Date of Patent: Sep. 17, 1996

[54] METHOD OF MAKING OPTICALLY FUSED SEMICONDUCTOR POWDER FOR SOLAR CELLS

[75] Inventors: Gary D. Stevens, Dallas, Tex.; Francois A. Padovani, Westwood, Mass.

[73] Assignee: Texas Instruments Incorporated, Dallas, Tex.

[21] Appl. No.: 368,229

[22] Filed: Jan. 3, 1995

[51] Int. Cl.$^6$ .................................................. H01L 31/18
[52] U.S. Cl. .............................. 437/4; 437/173; 437/249; 23/295 R; 117/75
[58] Field of Search ................................. 136/250; 437/2, 437/4, 5, 173, 249, 967; 117/73, 75, 921, 930, 931, 914; 423/349, 350; 23/295 R; 29/25.01

[56] References Cited

U.S. PATENT DOCUMENTS

| | | | |
|---|---|---|---|
| 4,131,659 | 12/1978 | Authier et al. | 427/26 |
| 4,341,588 | 7/1982 | Sterling | 117/930 |
| 4,565,913 | 1/1986 | Yatsurugi et al. | 437/173 |
| 4,599,244 | 8/1986 | Falckenberg et al. | 427/74 |
| 4,599,245 | 8/1986 | Falckenberg et al. | 427/74 |
| 4,637,855 | 1/1987 | Witter et al. | 156/616 |
| 4,643,797 | 2/1987 | Grabmaier et al. | 156/603 |
| 4,700,102 | 10/1987 | Camm et al. | 313/24 |
| 4,778,478 | 10/1988 | Barnett | 437/5 |
| 4,937,490 | 6/1990 | Camm et al. | 313/12 |
| 5,028,546 | 7/1991 | Hotchkiss | 437/2 |
| 5,048,163 | 9/1991 | Asmus et al. | 439/173 |
| 5,069,740 | 12/1991 | Levine et al. | 423/348 |
| 5,213,670 | 5/1993 | Bertagnolli et al. | 204/192 |
| 5,269,817 | 12/1993 | Schermutzki et al. | 23/295 R |
| 5,306,646 | 4/1994 | Lauf | 437/4 |
| 5,404,836 | 4/1995 | Milewski | 117/921 |
| 5,431,127 | 7/1995 | Stevens et al. | 437/5 |

OTHER PUBLICATIONS

"Continuous Melting of Silicon Ribbon", Vortek Industries Ltd, of Vancouver, British Columbia, Canada, Product Brochure, Sep. 1993.

Eyer, et al., "Silicon Sheets for Solar Cells Grown from Silicon Powder by the SSP Technique", *Journal of Crystal Growth*, 104, 1990, pp. 119–125.

Eyer, et al., "Silicon Sheets for Solar Cells Grown from Powder Layers: SSP-Method" pp. 714–718.

Eyer, et al., "Melt Recrystallization of Silicon Powder Layers" *18th IEEE Photovoltaic Specialists Conference*, 1985, pp. 1138–1141.

*Primary Examiner*—George Fourson
*Assistant Examiner*—S. Mulpuri
*Attorney, Agent, or Firm*—Robert C. Klinger; James C. Kesterson; Richard L. Donaldson

[57] ABSTRACT

A method and apparatus for forming semiconductor particles (42) for solar cells using an optical furnace (30). Uniform mass piles (26) of powered semiconductor feedstock are almost instantaneously optically fused to define high purity semiconductor particles without oxidation. The high intensity optical energy is directed and focused to the semiconductor feedstock piles (26) advanced by a conveyer medium (16) thereunder. The semiconductor feedstock piles (26) are at least partially melted and fused to form a single semiconductor particle (42) which can be later separated from a refractory layer (18) by a separator (50), preferably comprised of silica. The apparatus (10) and process is automated, providing a high throughput to produce uniform mass, high quality spheres for realizing high efficiency solar cells. The apparatus is energy efficient, whereby process parameters can be easily and quickly established.

14 Claims, 2 Drawing Sheets

METHOD OF MAKING OPTICALLY FUSED SEMICONDUCTOR POWDER FOR SOLAR CELLS

CROSS REFERENCE TO A RELATED APPLICATION

Cross reference is made to Co-pending patent application Ser. No. 08/323,317, entitled "Process for Producing Semiconductor Spheres", filed Oct. 14, 1994.

TECHNICAL FIELD OF THE INVENTION

This invention relates generally to photovoltaic solar cell arrays, and more particularly, to a method and apparatus for efficiently producing semiconductor spheres of uniform mass for use in a solar cell array.

BACKGROUND OF THE INVENTION

Solar cells are photovoltaic devices which convert the sun's solar energy into useful electrical energy. These solar cells typically comprise a matrix or array of doped semiconductor spheres embedded in a light-reflective aluminum foil, the semiconductor material typically comprising silicon. One such solar cell is disclosed in U.S. Pat. No. 5,028,546 to Hotchkiss, entitled "Method for Manufacture of Solar Cell with Foil Contact Point", assigned to the same assignee of the present invention. These solar cells typically are composed of a transparent matrix provided with spheroidal particles of silicon, each particle having a p-region exposed on one matrix surface, and an n-type region extending to an opposed matrix surface. Electrical energy is produced when photons of light strike the silicon sphere, inducing electrons to cross the depletion region between the two conductivity types.

Many methods of fabricating these semiconductor spheres are known in the art. In the ideal solar cell array, the spheres would be comprised of pure semiconductor material such as silicon, have uniform mass, be crystalline and spheroidal in shape, have a high conversion efficiency from solar to electrical energy, and be manufactured with high throughput by an automated apparatus. The ideal silicon sphere has a diameter of approximately 30 mils, realizes an energy efficiency of greater than 10%, and has a spheroidal shape achieved through performing few melt cycles.

As disclosed in U.S. Pat. No. 5,069,740 to Levine, one known method of fabricating silicon spheres includes first using a sieve to separate irregularly shaped metallurgical grade silicon particles by size. Particles obtained within a desired size range, are melted by a resistance heated open-hearth convection furnace operating above the melting point of silicon. The silicon particles may be heated at one atmosphere, whereby the surface tension of silicon will cause the particle to spheroidize, with a silicon dioxide skin being formed on the surface of the particle during the melting process. These particles are controllably cooled to obtain a spheroidal crystalline particle, whereby the silicon dioxide skin is removed using conventional grinding or chemical etching techniques, such as using an HF solution. Repeatably heating and cooling the particle will draw impurities from the silicon, such as boron, to the silicon dioxide skin. Thus, repeatably heating and cooling the particles helps obtain a more pure silicon sphere.

The resistance heated furnaces for melting silicon particles and powders are limited both in throughput and transport. This type of furnace does not directly couple heat to the silicon and, as a result, must heat the silicon and any underlying refractory material, as well as a transport tray, up to the melting point of silicon. Not only does this reduce energy efficiency, but the resultant delay in reaching the silicon melting point allows for pre-oxidation, which is the growth of silicon dioxide. Preooxidation of the silicon material reduces efficiency in conversion of silicon powder to fused particles, and broadens the mass distribution since some silicon is covered with silicon-dioxide, which prevents attachment to the fused particle. Formation of silicon monoxide gas also reduces overall silicon yield. The open hearth walking beam furnace is very limited with regard to temperature and transport adjustments.

Other known methods of fabricating consistent mass silicon spheres involves shotting molten purified silicon out of a nozzle, or from a rotating disk. The spheres formed in this manner are highly irregular in shape, and are polycrystalline. These spheres can later be made crystalline with the use of other processes, such as reheating the material above the melting point, and then controllable cooling the material as just described.

Another process for producing crystalline silicon spheres is disclosed in U.S. Pat. No. 4,637,855, incorporated herein by reference. Silicon spheres are fabricated by applying a slurry of metallurgical grade silicon on to the surface of a substrate capable of maintaining integrity at temperatures beyond the melting point of silicon. The layer of silicon slurry is then patterned to provide regions of metallurgical grade silicon. The substrate and silicon slurry are then heated above the melting point of silicon. The silicon rises and beads from the slurry to the surface as relatively pure silicon, and forms silicon spheres due to the high surface tension or cohesion of silicon. The spheres are then controllably cooled below the melting point of silicon, and the silicon spheres then crystalize.

Several authors (ie Siemens A.G. of Munich Germany) have published reports in the past of attempts to generate polycrystalline silicon ribbons in a continuous mode using concentrated light to melt silicon powder. All of the processes required multiple applications of heat in order to first consolidate the powder, then melt the consolidated sheet individually on each side. The sheet could not be fully melted as it would break up into small molten particles due to the surface tension of molten silicon. Additionally, throughputs greater than a few centimeters per minute were not achievable as the requirements or an ordered polycrystalline structure could not be met. These previous attempts all used low flux systems as high throughput capability was never considered possible for producing continuous polycrystalline ribbons.

To realize solar cells of high energy conversion efficiency, it is necessary that the semiconductor spheres be comprised of high purity material. High purity silicon spheres can ultimately be obtained by starting with either metallurgical grade, or semiconductor grade silicon. However, the greater the impurity of the starting material, the more involved the subsequent purification processes to ultimately obtain high purity silicon spheres. Again, a purification process involving additional melt/impurity removal cycles is time consuming, requires a substantial amount of energy, and results in lower overall silicon yield. These considerations need to be balanced against the cost of the starting material. The cost of semiconductor grade silicon feedstock is very expensive in relation to metallurgical grade silicon feedstock. However, the cost of off-spec semiconductor grade silicon feedstock is more in line with the cost of metallurgical grade silicon feedstock, and eliminates the need for silicon removals.

As disclosed in the cross referenced co-pending patent application, semiconductor particles of uniform mass can be obtained by metering out powdered feedstock into uniform mass piles of upon a refractory layer. These piles of semiconductor feedstock are then melted briefly to obtain unitary semiconductor particles of uniform mass. Silica is the preferred refractory layer, whereby the semiconductor particles can be separated from the refractory layer after the melt procedure. It is desirable to implement this unique metering process in an automated process control apparatus, where process parameters can be precisely controlled to obtain a high throughput of energy conversion efficient, uniform mass silicon spheres with little or no pre-oxidation.

SUMMARY OF THE INVENTION

The present invention implements a high-energy optical furnace to direct focused high intensity light to a plurality of semiconductor powered feedstock piles, to almost instantaneously fuse the piles efficiently. This precludes the growth of any oxide, allowing for maximum conversion of the powder to a fused particle, and limits the amount of heat lost to the underlying refractory layer and transport surface.

The optical furnace almost instantaneously melts the semiconductor powdered feedstock piles as they are passed by a belt conveyer thereunder, whereby the feedstock quickly freezes to form a single fused particle. This light is directly coupled to the silicon, with the use of a reflective underlying refractory substrate, and the silicon particles will wet each other rather than the substrate thus improving conversion. The feedstock can be partially or totally melted, cooled to a crystalline or polycrystalline particle and then separated from the powdered or granular refractory layer thereunder. Subsequent remelts may be implemented to improve sphericity and crystallinity. The piles of semiconductor feedstock are preferably metered out into uniform mass files using a template according to the techniques of the copending cross referenced patent application. This type of furnace can be rapidly adjusted on-line with regard to power levels and transport speed.

The method according to the preferred embodiment of the present invention comprises defining a plurality of spaced semiconductor feedstock piles upon a reflective refractory layer. High intensity optical energy is directed to the plurality of semiconductor feedstock piles, sufficient in intensity and duration to at least partially melt the semiconductor feedstock and define a single semiconductor particle. Preferably, the refractory layer comprises a thin layer of powered silica spread upon a belt conveyer, this refractory layer being advanced with the semiconductor feedstock piles under the optical furnace. The optical energy if focused to the silicon piles, with little heat being generated in the refractory layer. Preferably, the light has a flux density between approximately 400 W/cm$^2$, and 600 W/cm$^2$, whereby the conveyer medium is advanced at a rate between approximately 20 feet per minute and 30 feet per minute. In the preferred embodiment, a high-energy optical furnace with an elliptical reflection chamber is utilized, such as that manufactured by Vortek Industries Ltd. of Vancouver, British Columbia, Canada.

The silica refractory layer preferably has a thickness of about 1 millimeter. The conveyer medium is preferably a continuous belt which supports and advances the silica refractory layer, as well as the semiconductor feedstock piles, under the optical furnace and to a separation station. This separation station separates the fused semiconductor particles from the silica refractory layer, whereby the semiconductor particles are collected in one bin, and the refractory layer is collected in another bin and returned for subsequent use. Many types of separation devices can be used, including angled rod screens, vibrating screens, air cyclones, etc.

In the preferred embodiment, ambient air is purged from the optical furnace and around the semiconductor feedstock piles when the optical energy is directed to the feedstock piles, thus reducing the growth of oxide on the semiconductor material during the near instantaneous melt. Preferably, the focused optical energy is of sufficient energy to totally fuse the semiconductor feedstock piles, whereby the fused semiconductor material becomes substantially spheroidal.

The apparatus according to preferred embodiment of the present invention includes a refractory layer, and a mechanism for defining spaced piles of semiconductor feedstock upon the refractory layer. In the preferred embodiment, this mechanism includes a template for defining uniform mass piles of semiconductor powdered feedstock upon the refractory layer. A high-energy optical furnace is provided to direct and focus optical energy to the plurality of semiconductor powdered feedstock piles. This optical furnace directs sufficient light energy to at least partially melt and fuse the semiconductor feedstock piles, defining the semiconductor particles. A belt conveyer is utilized as a conveyer medium for advancing the refractory layer and the semiconductor feedstock piles thereon to the optical furnace for fusing. The semiconductor feedstock preferably comprises semiconductor grade silicon, but could also be metallurgical grade if desired. In addition, doped or undoped silicon feedstock can be utilized depending on the desired product output. Other semiconductor feedstock materials including germanium, gallium arsenide, and other well known semiconductor materials could be used as well. Nitrogen or argon gas is utilized for purging the optical furnace including the ambient around the semiconductor feedstock piles during the fuse melt. Because the fuse/melt is almost instantaneous, whereby the semiconductor particles almost instantaneously freeze thereafter, and the refractory layer has little heat provided thereto, the powder or granules of semiconductor feedstock wet one another rather than the refractory layer. With a purged ambient, oxide layers will not become lodged within the semiconductor particle.

With the optical energy directed and focused to a single point upon the refractory layer, and thus to the semiconductor feedstock piles as they are advanced therepast, a silica refractory layer of only 1 millimeter in depth is sufficient whereby the conveyer belt supporting the refractory layer will receive little or no energy and remain cool. That is to say, while the optical energy is sufficient to briefly raise the temperature of the semiconductor feedstock piles to about 1,450 degrees Celsius, the temperature at the conveyer surface is less than 100 degrees Celsius. In the preferred embodiment, the conveyer belt is comprised of polymers (i.e. silicone on woven fiberglass), but this conveyer belt could also be comprised of hard rubber or metals which will not buckle when heated by the temperatures experienced under the refractory layer. In the preferred embodiment, the semiconductor feedstock piles are heated from room temperature to around 1,450 degrees Celsius in about 0.2 seconds. The optical energy almost instantly melts the semiconductor feedstock piles, whereby the semiconductor particles almost instantaneously freeze thereafter because there is inadequate heat in the pile to maintain the silicon above the melting point.

DESCRIPTION OF THE PREFERRED EMBODIMENT

Figure 1:
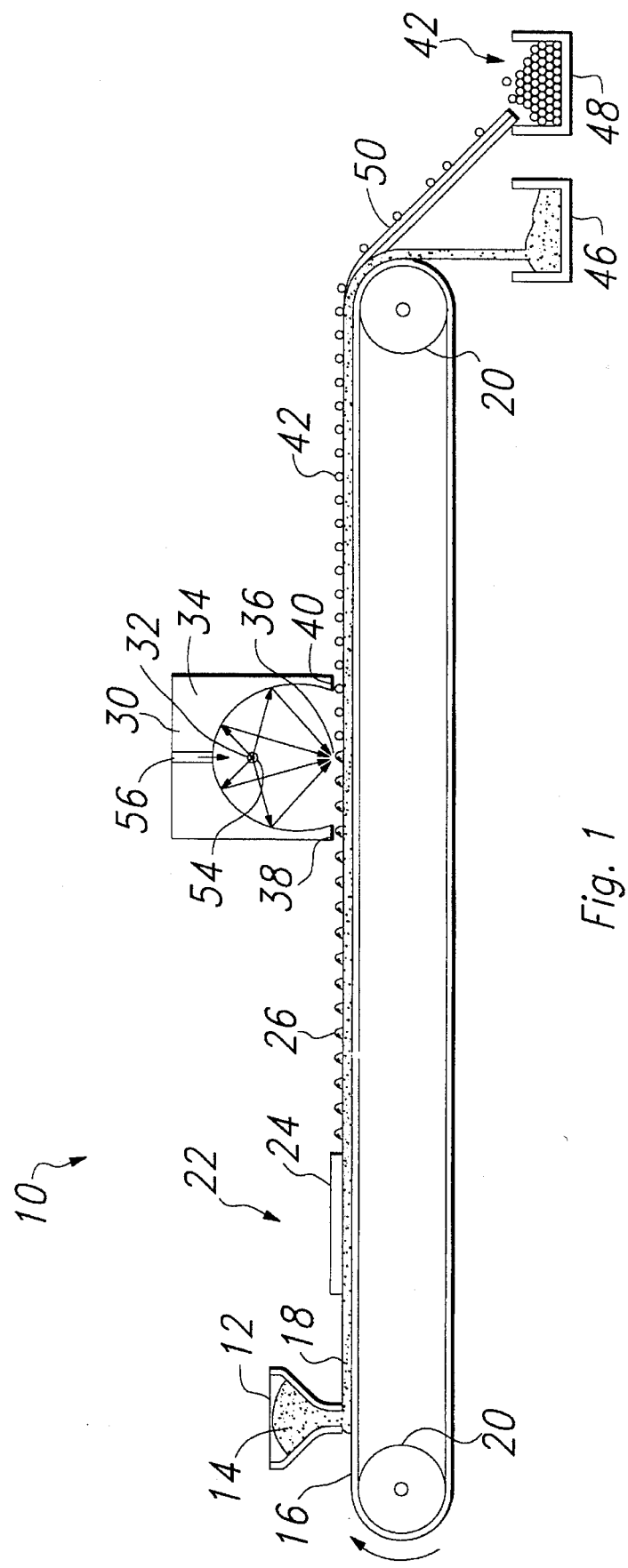
FIG. 1 is an elevational view of an apparatus including a high-energy optical furnace for fusing uniform mass piles of powered semiconductor feedstock according to the preferred embodiment of the present invention.

Referring now to FIG. 1, an automated high-throughput apparatus for forming high purity semiconductor particles according to the preferred embodiment of the present invention is generally shown at 10. Apparatus 10 as viewed from left to right is seen to include a dispensing bin 12 containing a quantity of powdered refractory material such as silica, and uniformly dispensing the silica 14 upon a rotating endless conveyer belt 16 to define a uniform thickness refractory layer 18. Conveyer belt 16 is advanced and regulated by a pair of opposed drive wheels 20, one disposed at each end of the conveyer 16 as shown. At a load station generally shown at 22, a template 24 is utilized automatically or by hand to meter out uniform mass piles of semiconductor powdered feedstock 26 such as silicon, according to the invention disclosed in the cross referenced co-pending patent application, the teachings of which are incorporated herein by reference. Semiconductor grade silicon feedstock 26 is preferably used, although metallurgical grade feedstock can be used if desired. In addition, either doped or undoped silicon feedstock can be used depending on the desired product output.

A high-energy optical arc furnace 30 is shown positioned over a mid section of conveyer belt 16 and including an arc lamp 32. Optical furnace 30 is preferable comprised of an arc furnace manufactured by Vortek Industries Ltd. of Vancouver, British Columbia, Canada. As depicted by the arrows in FIG. 1, the high intensity optical energy of lamp 32 is reflected off an elliptical inner wall 34 and directed to a single point 36 defined on the upper surface of refractory layer 18 and consequently is focused upon the piles of semiconductor feedstock 26 when advanced thereunder.

It is anticipated that other shapes of reflector walls 34 could be used as well, such as parabolic or u-shaped inner wall. The optical furnace manufactured by Vortek Industries is preferred because no other current technologies provide adequate flux density for a high throughout silicon melting process. A receiving end 38 and exit end 40 of furnace 30 is spaced approximately 1 centimeter above the surface of refractory layer 18 to permit the piles of semiconductor feedstock 26 to be advanced thereunder, and fused to form unitary semiconductor particles 42. At the distal end of apparatus 10 is seen a refractory layer collection bin 46, and a semiconductor particle collection bin 48. An angled rod screen 50 is shown oriented just before the falling stream of refractory layer 18, this screen skimming the unitary semiconductor particles 42 from the refractory layer 18, and directing these particles 42 into collection bin 48, as shown.

In the preferred embodiment, refractory layer 18 preferably has a depth of 1 millimeter. Template 24, as disclosed in the co-pending patent application incorporated herein by reference, includes an array of apertures (not shown) extending through template 24. These apertures are loaded with powered semiconductor feedstock at loading station 22, the upper surface being smoothed and removed of excess powdered feedstock such as by doctor blading before being removed from refractory layer 16 to defined the semiconductor feedstock piles 26. This metering out process of piles 26 by template 24 could be automated if desired, but is beyond the teachings of the present invention.

Optical furnace 30 has a central chamber 54 which can be purged of ambient air by introducing a non-reactive gas via duct 56, such as nitrogen or argon, into chamber 54 during the fusing process. Thus, as semiconductor feedstock piles 26 are almost instantaneously fused, ambient impurities will not be present and cannot impregnate the semiconductor piles 26 as they are fused to define unitary semiconductor particles 42. Purging the chamber of a conventional convection furnace is well know in the art, and is equally applicable to an optical furnace as disclosed in the present invention. By purging the ambient about the semiconductor feedstock piles 26 being fused, and focussing the light energy on the piles 26, the grains of the semiconductor feedstock powder are wetted and easily coalesce with one another. With impurities removed, included oxygen, silicon dioxide is not formed on the surface of the particle 42, and all semiconductor material is converted to form the single particle. Accordingly, no subsequent dean up such as grinding or chemically treating with an acid solution, such as HF, is necessary.

Figure 2:
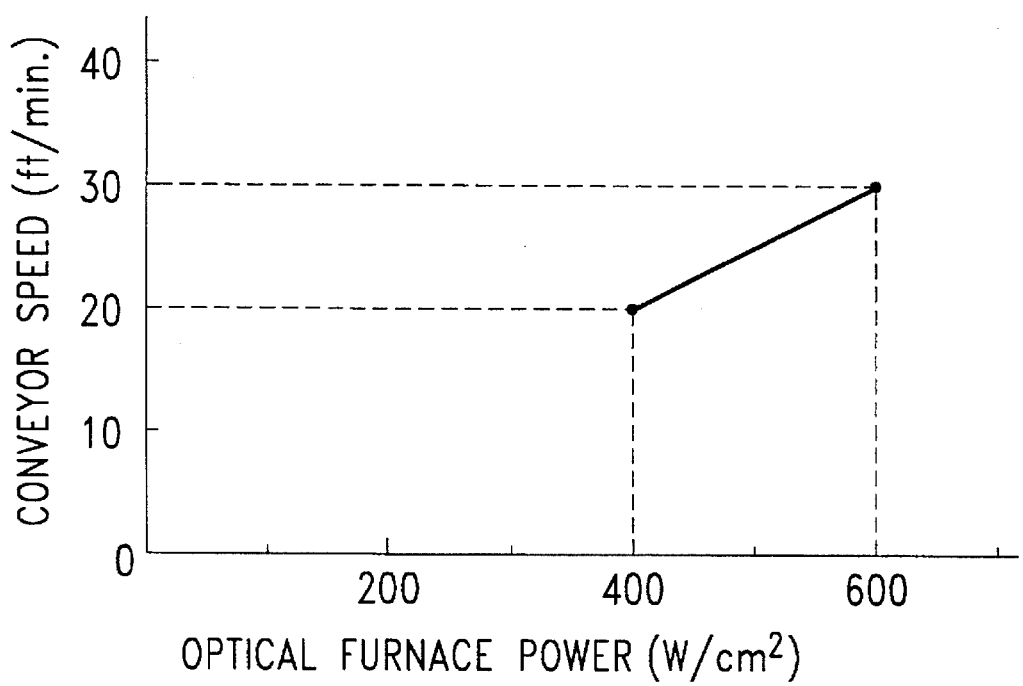
FIG. 2 is a graph of the preferred optical furnace flux density as a function of the conveyer belt speed to obtain at least partially melted semiconductor feedstock piles.

Referring to the graph of FIG. 2, it can be seen that the preferable operating flux density of optical furnace 30 is between 400 and 600 $W/cm^2$, with the speed of conveyer 16 advanced between 20 and 30 feet per minute. The slower the speed of the belt, the lower the required flux density of the furnace to at least partially melt the piles of semiconductor feedstock 26. In the preferred embodiment, the maximum flux density is about 600 $W/cm^2$ with a conveyer speed of about 30 feet per second. Although these are the preferred parameters for the present invention, limitation to these speeds or flux densities is not to be inferred, for other parameters could be chosen as well, depending on the desired completion of melt of the piles, and the desired uniformity of the melt between the plurality of semiconductor piles. One feature of the present invention is that the process parameters including optical flux density and belt speed can be changed or set almost instantaneously, with no warm-up time being required. This is a considerable improvement over using conventional open hearth resistance heated furnaces.

METHOD OF OPERATION

Referring now to FIG. 1, the method according to the preferred embodiment of the present invention will be described. With drive rollers 20 uniformly advancing conveyer 16 at approximately 20 to 30 feet per minute, dispenser bin 12 dispenses the powdered silica 14 upon the upper surface of conveyer 16 to define a uniform thickness refractory layer 18 of approximately 1 millimeter in thickness.

At semiconductor pile loading station 22, template 24 is utilized to meter out a plurality of uniform mass semiconductor feedstock piles 26. Referring to the cross referenced co-pending patent application incorporated herein by reference, each of the holes (not shown) of template 24 are completely filled with powered semiconductor feedstock, which is preferable of semiconductor grade but could also be comprised of metallurgical grade semiconductor powered feedstock if desired. The excess semiconductor feedstock is removed from the upper surface of template 24 by a suitable smoothing tool or by doctor blading as desired. Template 24 is then carefully removed from refractory layer 16 to define a plurality of uniform mass semiconductor feedstock piles 26, as shown.

Conveyer 16 advances semiconductor feedstock piles 26 at a uniform rate under the receiving end 38 of optical furnace 30, and into chamber 54. As the semiconductor feedstock piles 26 advance to point 36 within chamber 54, the high intensity optical energy continuously radiating from arc lamp 32 reflects off the elliptical walls 34 and is focused to point 36, and thus the semiconductor feedstock piles 26. With the optical furnace having a flux density of between 400 and 600 W/cm$^2$, and conveyer 16 advancing the semiconductor particles 26 at 20 to 30 feet per minute, the optical energy will almost instantaneously wet, melt and fuse the particles of feedstock material, in about 0.2 seconds. The melting point of silicon is approximately 1,450 Celsius. The optical energy provided by lamp 32 is preferably sufficient to only accomplish an incomplete melt, whereby each of the grains of feedstock only begins to coalesce with the adjacent grains. However, the energy is sufficient to cause the grains of feedstock to fuse to one another and form a unitary semiconductor particle 42. If desired, the optical energy and/or the speed of the conveyer could be established to completely melt the piles of semiconductor feedstock 26, whereby the powdered feedstock would coalesce and completely melt.

Since the light energy is focused on the feedstock pries 26, the refractory layer 18 receives little energy and is heated very little. Thus, the feedstock granules wet on another, not the refractory layer. The chamber 54 is purged of air by introducing a non-reactive gas, such as nitrogen or argon, via duct 56 to avoid introducing impurities into particle 42. Because the fuse process is almost instantaneous, there is little or no pre-oxidation, and the conversion of the silicon is almost completely to form unitary particle 42, and uniform mass particles 42 are realized. In addition, subsequent grinding or chemical etching clean-up procedures are not necessary.

Conveyer 16 advances the fused semiconductor particles 42 from fuse point 36, whereby these particles will almost instantaneously freeze to form polycrystalline particles 42 because the optical energy in the pile 26 is inadequate to maintain the semiconductor material above its melting point. Conveyer 16 advances the semiconductor particles 42 under the exiting end 40 of optical furnace 30, and advances the particles to the distal end of the apparatus. Furnace 30 may have a shroud to effect the purging process if desired.

At the distal end of the apparatus, the rod screen 50 skims the unitary semiconductor particles 42 from the refractory layer 16 being poured into collection bin 46. The semiconductor particles 42 are guided into the receiving collecting bin 48, as shown. Rod screens are well known in the art and are preferred in the present invention, although other alternatives are known and acceptable including vibrating screens and air cyclones.

The semiconductor particles 42 collected in bin 48 are then subsequently reprocessed by one or more heating and cooling (melting) cycles to remove impurities if necessary, and to obtain a crystalline semiconductor sphere. These subsequent heating and purification processes can be performed using the above process, or using processes well known in the art, some of which are referenced in the Background of the Invention section of this application. If desired, the semiconductor particles 42 could be reprocessed by advancing them under the optical furnace 30 as just described, at the same rate or a different rate, and at the same or different optical flux density just described. The obtained semiconductor spheres are ultimately implemented in a solar cell.

According to the preferred embodiment of the present invention, a high throughput apparatus and method is provided. Uniform mass semiconductor particles 42 are obtained without introducing impurities into the particle during the optical fusing process. The optical furnace 30 is power efficient since there is no warm up time for the furnace, and energy can be directly applied to mainly the piles of semiconductor feedstock without any significant energy being directed into the refractory layer 16. Thus, both a waste of time and energy is avoided using an optical furnace, as compared to a conventional convection furnace.

The process parameters including rate at which conveyer 16 is advanced, and the flux density at which optical furnace 30 operates, can also be precisely and instantaneously controlled. This permits the control of throughput, and of the texture of semiconductor particles 42 whether they be partially or totally melted during the fusing process. When pure semiconductor feedstock is utilized to define piles 26, a pure semiconductor particle 42 is realized, and when which implemented in a solar cell array, realizes a high efficiency solar cell array with an energy conversion well in excess of 10%. While silicon is the preferred semiconductor feedstock processed according to the present invention, other well known semiconductor feedstock materials could be utilized as well including germanium and galium arsenide if desired. In the preferred embodiment, semiconductor particles 42 have a diameter of approximately 30 mils.

Silica is the preferred material for refractory layer 18. However, other refractory materials could be used as well, including quartz boats if desired. However, silica is ideal in that a very smooth reflective layer can be defined for supporting semiconductor feedstock piles 26, is relatively inexpensive, and can be easily reprocessed by collecting in collection bin 46, as shown.

In the preferred embodiment, more than 200,000 semiconductor particles 42 can be defined per minute in a 1 foot wide melt furnace. Of course, this throughput is limited only by the dimensions and process parameters associated with the present invention, and higher throughputs could be realized by using a larger conveyer, a larger template, and/or using optical furnace with a higher flux density.

Because the process of the present invention is truly automated, the associated cost for manufacturing high-quality semiconductor particles is very appealing. Highly uniform semiconductor particles are obtained, of high purity and consistency. The present invention overcomes the drawbacks associated with implementing conventional convection furnaces.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A method of forming semiconductor particles, comprising the steps of:

a) defining a plurality of spaced piles of semiconductor feedstock upon a refractory layer; and b) directing optical energy to said plurality of semiconductor feedstock piles of sufficient energy to at least partially melt said semiconductor feedstock and define said semiconductor particles, wherein said method further comprising the step of defining said refractory layer upon a conveyor medium, and advancing said conveyor medium to advance said semiconductor feedstock piles past said directed optical energy.

2. The method as specified in claim 1 further comprising the step of directing said optical energy with a flux density between approximately 400 W/cm$^2$ and 600 W/cm$^2$.

3. The method as specified in claim 1 comprising the step of advancing said conveyer medium at a rate between approximately 20 ft/minute and 30 ft/minute.

4. The method as specified in claim 1 comprising the step of forming a layer of silica on said conveyer medium as said refractory layer.

5. The method as specified in claim 1 comprising the step of utilizing silicon as said semiconductor feedstock.

6. The method as specified in claim 1 comprising the step of utilizing doped said semiconductor feedstock.

7. The method as specified in claim 4 comprising the step of defining said silica layer with a thickness of about 1 mm.

8. The method as specified in claim 1 comprising the step of utilizing a template to define said semiconductor feedstock piles.

9. The method as specified in claim 1 comprising the step of utilizing an optical arc furnace to direct and focus said optical energy to said semiconductor feedstock piles.

10. The method as specified in claim 4 comprising the step of separating said semiconductor particles from said silica refractory layer.

11. The method as specified in claim 10 comprising the step of collecting said silica refractory layer after said separation from said semiconductor particles and reprocessing said silica refractory layer.

12. The method as specified in claim 1 further comprising the step of purging ambient air from about said semiconductor feedstock piles when directing said optical energy thereat.

13. The method as specified in claim 1 comprising the step of directing said optical energy of sufficient energy to totally fuse said semiconductor feedstock piles.

14. The method as specified in claim 13 comprising the step of directing said optical energy of sufficient energy that said semiconductor feedstock piles fuse and form generally spheroidal said semiconductor particles.

* * * * *

UNITED STATES PATENT AND TRADEMARK OFFICE
CERTIFICATE OF CORRECTION

PATENT NO. : 5,556,791
DATED : September 17, 1996
INVENTOR(S) : Gary D. Stevens, Francois A. Padovani It is certified that error appears in the above-indentified patent and that said Letters Patent is hereby corrected as shown below:

Column 1, after line 10, insert --
"The Government of the United States of America has rights in this invention pursuant to Subcontract No. ZAI-4-11294-04 awarded by the U.S. Department of Energy." --

Signed and Sealed this

Eighth Day of April, 1997

Attest:

BRUCE LEHMAN

Attesting Officer          Commissioner of Patents and Trademarks